(12) United States Patent
Narathong et al.

(10) Patent No.: US 8,688,058 B2
(45) Date of Patent: Apr. 1, 2014

(54) TECHNIQUES FOR IMPROVING TRANSMITTER PERFORMANCE

(76) Inventors: Chiewcharn Narathong, Laguna Niguel, CA (US); Wenjun Su, San Diego, CA (US)

( * ) Notice: Subject to any disclaimer, the term of this patent is extended or adjusted under 35 U.S.C. 154(b) by 1103 days.

(21) Appl. No.: 12/277,022

(22) Filed: Nov. 24, 2008

(65) Prior Publication Data

US 2010/0130144 A1 May 27, 2010

(51) Int. Cl.
*H04B 1/04* (2006.01)
(52) U.S. Cl.
USPC ........................................................ 455/114.3
(58) Field of Classification Search
USPC ........................................... 455/114.2, 114.3
See application file for complete search history.

(56) References Cited

U.S. PATENT DOCUMENTS

| | | | | |
|---|---|---|---|---|
| 2,365,575 A | * | 12/1944 | Maxwell | 330/90 |
| 3,467,804 A | * | 9/1969 | Smith | 219/706 |
| 3,970,866 A | * | 7/1976 | Fulkerson | 326/125 |
| 3,971,979 A | * | 7/1976 | Mayfield | 323/315 |
| 4,015,464 A | * | 4/1977 | Miller et al. | 73/61.75 |
| 4,021,726 A | * | 5/1977 | Garroway et al. | 324/309 |
| 4,423,547 A | * | 1/1984 | Farrar et al. | 438/623 |
| 4,492,962 A | * | 1/1985 | Hansen | 342/369 |
| 4,803,423 A | * | 2/1989 | Boutigny | 324/130 |
| 5,076,094 A | * | 12/1991 | Frye et al. | 73/19.03 |
| 5,204,975 A | * | 4/1993 | Shigemori | 455/231 |
| 5,546,072 A | * | 8/1996 | Creuseremee et al. | 340/574 |
| 5,673,001 A | * | 9/1997 | Kim et al. | 330/284 |
| 5,815,115 A | * | 9/1998 | Carloni et al. | 342/359 |
| 5,913,154 A | * | 6/1999 | Wynn | 455/127.2 |
| 6,111,459 A | | 8/2000 | Nishijima et al. | |
| 6,794,935 B2 | * | 9/2004 | Klomsdorf et al. | 330/129 |
| 6,952,456 B1 | * | 10/2005 | Aiello et al. | 375/295 |
| 7,257,382 B2 | | 8/2007 | Arai et al. | |
| 7,474,708 B1 | * | 1/2009 | Khlat et al. | 375/296 |
| 2006/0068727 A1 | | 3/2006 | Salvi | |
| 2007/0096843 A1 | * | 5/2007 | Mizuno | 333/17.1 |
| 2007/0285154 A1 | | 12/2007 | Darabi et al. | |
| 2011/0294452 A1 | * | 12/2011 | Kawai et al. | 455/293 |

OTHER PUBLICATIONS

International Search Report and Written Opinion—PCT/US2009/065807, International Search Authority—European Patent Office—Jan. 28, 2010.
Shoji Otaka et al.: "A 1.9-GJz Direct Conversion Transmitter I C with Low Power On-Chip Frequency Doubler" Analog Integrated Circuits and Signal Processing, vol . 25, No. 3, Dec. 2000, pp. 261-269, XP002564259.
Taiwan Search Report—TW098140047—TIPO—Oct. 16, 2012.

* cited by examiner

*Primary Examiner* — William Hernandez
(74) *Attorney, Agent, or Firm* — Ramin Mobarhan

(57) ABSTRACT

Exemplary embodiment are directed to preserving transmitter linearity in RF transceivers while reducing RX band noise for use with low-power voltage supplies. In one aspect, a programmable attenuation element may be provided on-chip at the output of a driver amplifier, prior to a matching network. In another aspect, the programmable attenuation element may include a plurality of switchable capacitors.

20 Claims, 4 Drawing Sheets

TECHNIQUES FOR IMPROVING TRANSMITTER PERFORMANCE

TECHNICAL FIELD

The disclosure relates to communications transmitters, and more particularly, to techniques for improving transmitter linearity and reducing transmitter noise.

BACKGROUND

In the design of transmitters for ultra-deep submicron CMOS wireless transceivers, it is desirable to minimize transmitter (TX) emissions in one or more receive frequency bands (i.e., RX band noise) while preserving overall transmitter linearity. In a typical design, a transmitter circuit may employ multiple successive gain stages, wherein more gain is assigned to the earlier stages (e.g., close to baseband) than to the later stages (e.g., close to the transmitter output). To reduce RX band noise, an off-chip attenuator (e.g., an output pad) may be used to attenuate the noise during the later gain stages, e.g., prior to amplification by an off-chip power amplifier.

The use of an off-chip attenuator to reduce RX band noise suffers from at least two drawbacks. First, an off-chip attenuator such as an output pad typically provides only a fixed attenuation level, without the option of scalable attenuation. This may limit the flexibility of the off-chip attenuator, as well as increase the number of external components required. Second, since the off-chip attenuator will generally attenuate both TX signal and noise power, the TX signal swing at the input and output of the transmitter gain stage prior to the off-chip attenuator (e.g., a driver amplifier) must be made larger to compensate for the attenuation. This may adversely affect the transmitter linearity, as well as undesirably increase transmitter power consumption.

It would be desirable to provide flexible, low-power techniques for minimizing RX band noise while preserving overall transmitter linearity.

DETAILED DESCRIPTION

The detailed description set forth below in connection with the appended drawings is intended as a description of exemplary embodiments of the present invention and is not intended to represent the only exemplary embodiments in which the present invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well known structures and devices are shown in block diagram form in order to avoid obscuring the novelty of the exemplary embodiments presented herein.

Figure 1:
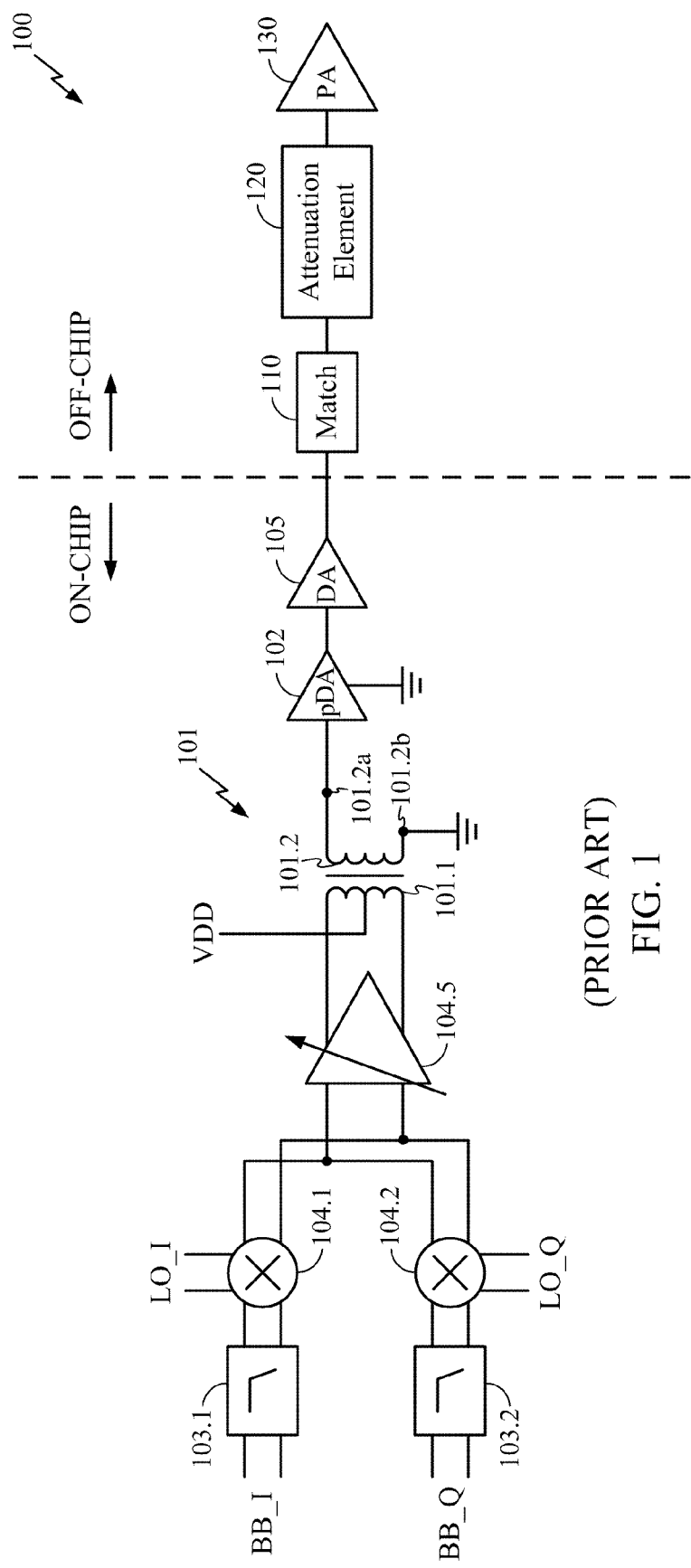
FIG. 1 depicts a prior art transmitter circuit for a communications device.

FIG. 1 depicts a prior art transmitter circuit 100 for a communications device. Note the transmitter architecture depicted in FIG. 1 is shown for illustration only. One of ordinary skill in the art will realize that alternative transmitter architectures may omit some of the elements shown, or incorporate other elements not shown. The techniques of the present disclosure are contemplated to apply to such alternative transmitter architectures.

In FIG. 1, baseband input signals BB_I (in-phase) and BB_Q (quadrature-phase) are provided to low-pass filters 103.1 and 103.2 The output signals of the low-pass filters are provided to mixers 104.1 and 104.2, which upconvert the filtered baseband signals to a higher frequency by multiplying them with local oscillator signals LO_I and LO_Q, respectively. The differential outputs of the mixers 104.1 and 104.2 are combined and provided to a variable-gain amplifier (VGA) 104.5, whose gain is dynamically controlled. The differential output of the VGA 104.5 is then coupled to a balun primary element 101.1 of balun 101. Balun 101 also includes a balun secondary element 101.2 electromagnetically coupled to the balun primary element 101.1. The balun 101 functions to convert a differential voltage across the balun primary element 101.1 to a single-ended voltage at node 101.2a of the balun secondary element 101.2, wherein the other node 101.2b of the balun secondary element 101.2 is coupled to a ground voltage. The balun primary inductance 101.1 is tapped to a DC supply voltage VDD, and the AC voltage at either node of the balun primary inductance 101.1 may generally exceed VDD.

In FIG. 1, the node 101.2a of the balun secondary element 101.2 is coupled to a pre-driver amplifier (pDA) 102, followed by a driver amplifier (DA) 105. The output of the DA 105 is supplied to an off-chip matching network 110. One of ordinary skill in the art will appreciate that the matching network 110 may be used to transform the impedance presented to the output of the DA 105 by a subsequent load following the matching network 110, such that power may be efficiently transferred from the DA 105 to the load. For example, the matching network 110 may match a less than 50-Ohm output impedance of the DA 105 to a 50-Ohm input impedance of the load.

As previously mentioned, one design consideration for the transmitter 100 of FIG. 1 is to minimize the level of noise generated by the transmitter 100 in one or more receive (RX) frequency bands. To reduce such "RX band noise," the output of the matching network may be coupled to an attenuation element 120, such as shown in FIG. 1, prior to being coupled to a load such as a power amplifier 130. The attenuation element 120 may reside off-chip, and may a fixed level of resistive attenuation, e.g., 3 dB, or 5 dB.

While the attenuator 120 may help reduce the RX band noise generated by the transmitter 100, the attenuator 120 may also undesirably reduce the power of the TX signal to be transmitted. To compensate for the TX signal attenuation of the attenuator 120, the driver amplifier 105 must typically generate larger transmit signal swing. This may undesirably degrade the linearity of the transmitter, as well as increase its power consumption.

Figure 2:
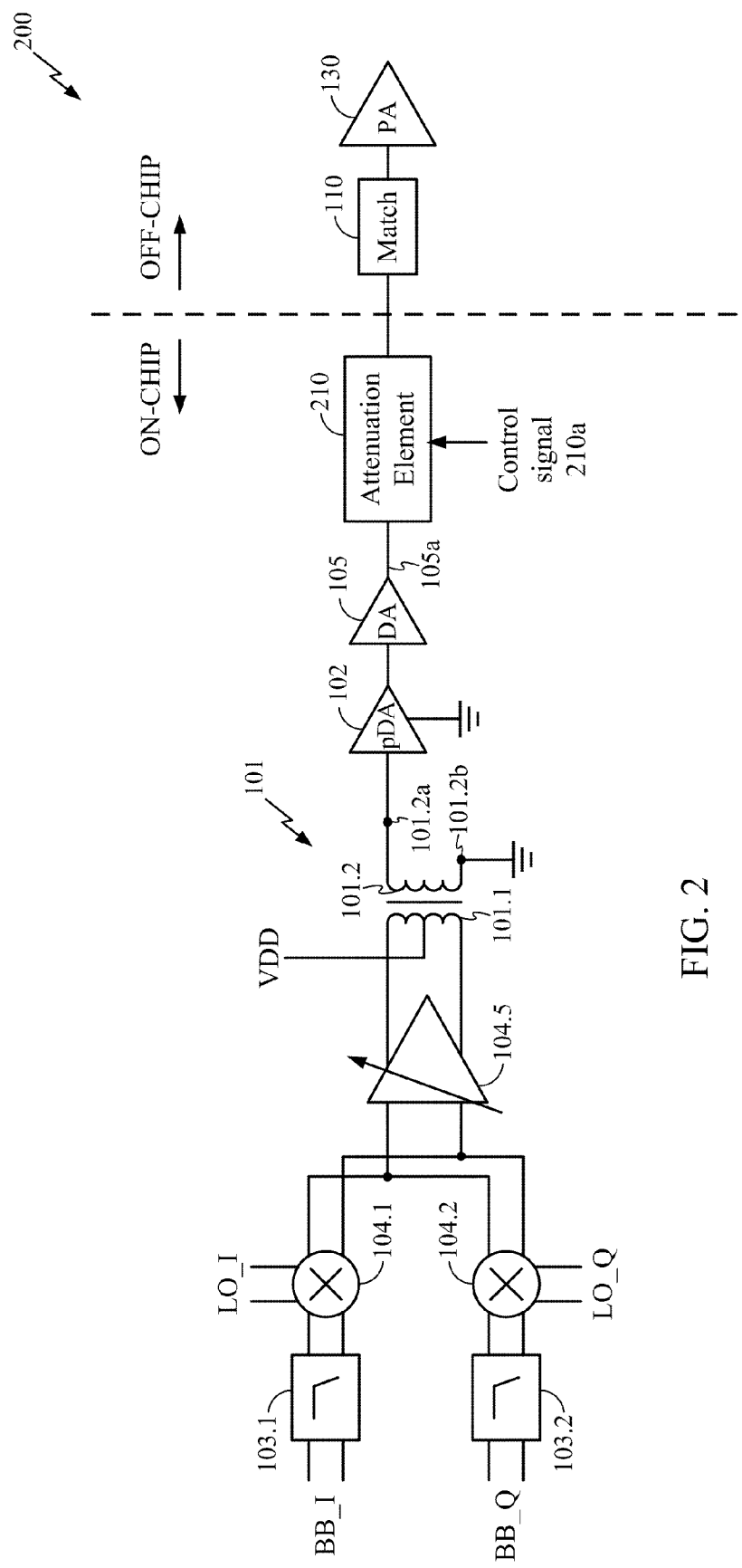
FIG. 2 depicts an exemplary embodiment of a transmitter circuit according to the present disclosure.

FIG. 2 depicts an exemplary embodiment of a transmitter circuit 200 according to the present disclosure. In FIG. 2, an attenuation element 210 is provided following the driver amplifier 105 and prior to the matching network 110.

One of ordinary skill in the art will appreciate that by providing the attenuation element 210 prior to the matching network 110 rather than after the matching network 110, the DA 105 need not generate as large of a signal swing to drive the off-chip power amplifier 130. This better preserves the linearity of the DA 105, as well as decreases the overall power consumption of the DA 105.

In an exemplary embodiment, the attenuation element 210 may be provided on-chip, i.e., on the same integrated circuit as the DA 105. As an on-chip attenuator may be designed to be coupled to the output of the DA 105 without excessively long routing and/or tracing, the parasitic elements associated with an on-chip attenuation element 210 are expected to be less than those associated with an off-chip attenuator. Thus the power loss due to such parasitic elements is also expected to be less for an exemplary embodiment using an on-chip attenuator.

In an exemplary embodiment, the attenuation element 210 may be implemented using capacitive elements rather than resistive elements. One of ordinary skill in the art will appreciate that capacitive elements may advantageously generate less noise than resistive elements.

In an exemplary embodiment, the level of attenuation provided by the attenuation element 210 may be made selectable. For example, a control signal 210a may select an appropriate level of attenuation for the attenuation element 210.

Figure 3:
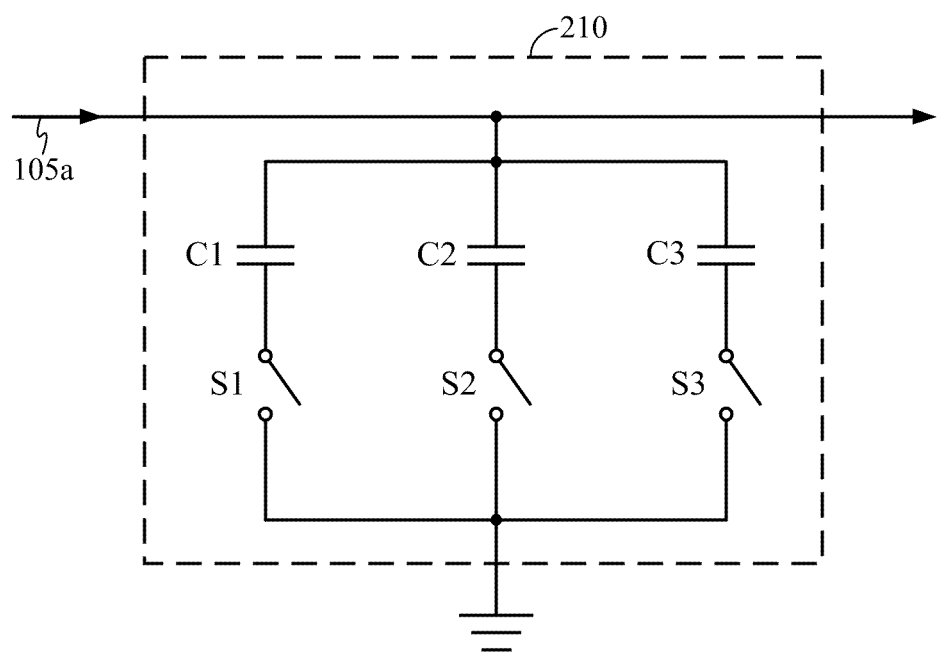
FIG. 3 depicts an exemplary embodiment of an attenuation element providing selectable attenuation level.

FIG. 3 depicts an exemplary embodiment of an attenuation element 210 providing selectable attenuation level. In FIG. 3, a plurality of capacitors C1, C2, C3 are coupled to output node 105a of the DA 105. Each capacitor is series-coupled to a corresponding switch S1, S2, S3. The switches may be configured to select which of the capacitors to enable in the attenuation element 210. In an exemplary embodiment, the capacitors may have binary-weighted capacitances to enable a wide range of selectable attenuation levels. Other exemplary embodiments may utilize fewer or more capacitors and/or other passive or active circuit elements. For example, a plurality of capacitors may be provided to allow the total capacitance to be configurable from 0 pF to 35 pF, in steps of 5 pF.

In an exemplary embodiment, the capacitors in the attenuation element 210 are implemented on-chip, and therefore their configuration may be readily selected by providing one or more on-chip control signals.

One of ordinary skill in the art will appreciate that the exemplary embodiment of FIG. 3 is shown for illustrative purposes only. For example, the attenuation element 210 may also be implemented using a switched resistor network. Such alternative exemplary embodiments are contemplated to be within the scope of the present disclosure.

Figure 4:
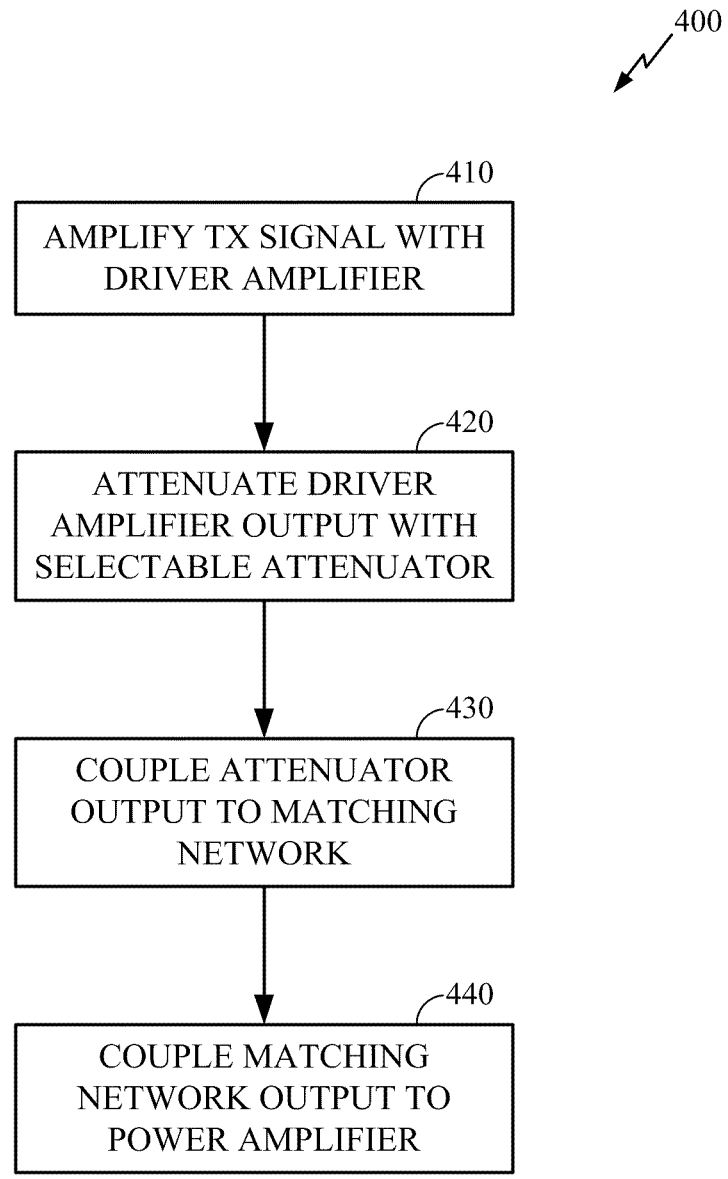
FIG. 4 depicts an exemplary embodiment of a method according to the present disclosure.

FIG. 4 depicts an exemplary embodiment of a method 400 according to the present disclosure. Note the method 400 is shown for illustrative purposes only, and is not meant to limit the scope of the present disclosure to any particular method.

In FIG. 4, at step 410, a TX signal is amplified using a driver amplifier.

At step 420, the driver amplifier output signal is attenuated using a selectable attenuator. In an exemplary embodiment, both the driver amplifier and the selectable attenuator may reside on-chip in a single integrated circuit.

At step 430, the attenuator output signal is coupled to a matching network.

At step 440, the matching network output signal is coupled to a power amplifier for further amplification.

In this specification and in the claims, it will be understood that when an element is referred to as being "connected to" or "coupled to" another element, it can be directly connected or coupled to the other element or intervening elements may be present. In contrast, when an element is referred to as being "directly connected to" or "directly coupled to" another element, there are no intervening elements present.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the exemplary embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the exemplary embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the exemplary embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosed exemplary embodiments is provided to enable any person skilled in the art to make or use the present invention. Various modifications to these exemplary embodiments will be readily apparent to those skilled in the art, and the generic principles defined herein may be applied to other exemplary embodiments without departing from the spirit or scope of the invention. Thus, the present invention is not intended to be limited to the exemplary embodiments shown herein but is to be accorded the widest scope consistent with the principles and novel features disclosed herein.

The invention claimed is:

1. A method for reducing noise generated by a transmitter circuit, the method comprising:
    amplifying a transmit (TX) signal using a driver amplifier;
    attenuating received band noise in the output signal of the driver amplifier at a level that preserves linearity of the driver amplifier using an attenuator, the attenuator having a selectable attenuation level, wherein both the driver amplifier and the attenuator reside on-chip in a single integrated circuit; and
    coupling the output signal of the attenuator to a matching network.

2. The method of claim 1, the driver amplifier and attenuator residing on a single integrated circuit (IC), the method further comprising:
    coupling the output signal of the matching network to a power amplifier.

3. The method of claim 1, the method further comprising selecting the selectable attenuation level for the attenuator.

4. The method of claim 3, the attenuator comprising a plurality of capacitors, the selecting the selectable attenuation level comprising:
    selectively enabling at least one of the capacitors.

5. An apparatus for reducing noise generated by a transmitter circuit, the transmitter circuit comprising a driver amplifier for amplifying a transmit (TX) signal, the apparatus comprising:
    an attenuator having a selectable attenuation level for attenuating received band noise in the output signal of the driver amplifier at a level that preserves linearity of the driver amplifier, wherein both the driver amplifier and the attenuator reside on-chip in a single integrated circuit, the output signal of the attenuator coupled to a matching network.

6. The apparatus of claim 5, the apparatus being an integrated circuit (IC), the driver amplifier and attenuator residing on the IC, the output signal of the matching network further coupled to a power amplifier.

7. The apparatus of claim 5, the apparatus further comprising a control signal for selecting the selectable attenuation level for the attenuator.

8. The apparatus of claim 7, the attenuator comprising a plurality of capacitors, the control signal selecting the selectable attenuation level by selectively enabling at least one of the capacitors.

9. The apparatus of claim 5, the attenuator comprising a plurality of capacitors having binary-weighted capacitances.

10. The apparatus of claim 5, the attenuator configured to receive one or more on-chip control signals for selecting the attenuation level.

11. An apparatus for reducing noise generated by a transmitter circuit, the apparatus comprising:
    means for amplifying a transmit (TX) signal;
    means for attenuating received band noise in the output signal of the means for amplifying at a level that preserves linearity of the means for amplifying, wherein both the means for amplifying and the means for attenuating reside on-chip in a single integrated circuit; and
    means for converting the impedance of the output of the means for attenuating to a different impedance.

12. The apparatus of claim 11, the means for amplifying and the means for attenuating residing on a single integrated circuit (IC), the output signal of the means for converting further coupled to a power amplifier.

13. The apparatus of claim 11, the apparatus further comprising means for selecting a selectable attenuation level for the means for attenuating.

14. The apparatus of claim 13, the means for attenuating comprising a plurality of capacitors, the means for selecting the selectable attenuation level comprising means for selectively enabling at least one of the capacitors.

15. A method, comprising:
    amplifying a transmit (TX) signal with a driver amplifier;
    attenuating received band noise in an output signal of the driver amplifier at a level that preserves linearity of the driver amplifier with an attenuator, wherein both the driver amplifier and the attenuator reside on-chip in a single integrated circuit; and
    matching an impedance of the driver amplifier to an impedance of a load.

16. The method of claim 15, further comprising coupling a matching network between the attenuator and a power amplifier.

17. The method of claim 15, the method further comprising selecting an attenuation level of the attenuator.

18. The method of claim 17, the selecting an attenuation level of the attenuator comprising enabling at least one of a plurality of capacitors of the attenuator.

19. The method of claim 18, the enabling at least one of a plurality of capacitors of the attenuator comprises enabling at least one of a plurality of binary-weighted capacitors.

20. The method of claim 15, further comprising providing one or more on-chip control signals to select an attenuation level of the attenuator.

* * * * *